(12) United States Patent
Stoneham et al.

(10) Patent No.: US 7,813,145 B2
(45) Date of Patent: Oct. 12, 2010

(54) CIRCUIT STRUCTURE WITH MULTIFUNCTION CIRCUIT COVER

(75) Inventors: Edward B. Stoneham, Los Altos, CA (US); Thomas M. Gaudette, Cameron Park, CA (US)

(73) Assignee: Endwave Corporation, San Jose, CA (US)

( * ) Notice: Subject to any disclaimer, the term of this patent is extended or adjusted under 35 U.S.C. 154(b) by 835 days.

(21) Appl. No.: 11/692,129

(22) Filed: Mar. 27, 2007

(65) Prior Publication Data

US 2007/0190858 A1  Aug. 16, 2007

Related U.S. Application Data

(63) Continuation-in-part of application No. 10/882,886, filed on Jun. 30, 2004, now abandoned.

(51) Int. Cl.
*H05K 9/00* (2006.01)
(52) U.S. Cl. .................... 361/818; 361/752
(58) Field of Classification Search ............ 361/752, 361/800, 797, 730, 816, 818, 799, 760; 174/35 R, 174/51
See application file for complete search history.

(56) References Cited

U.S. PATENT DOCUMENTS

| | | | |
|---|---|---|---|
| 3,351,806 A | 11/1967 | Sear et al | |
| 3,863,181 A | 1/1975 | Glance et al | |
| 4,045,750 A | 8/1977 | Marshall | |
| 4,218,578 A | 8/1980 | Olschewski et al. | |
| 4,600,907 A | 7/1986 | Greliman et al. | |
| 4,614,922 A | 9/1986 | Bauman et al. | |
| 4,642,569 A | 2/1987 | Hayes et al. | |
| 4,814,943 A | 3/1989 | Okuaki | |
| 5,030,935 A | 7/1991 | Williams et al. | |
| 5,105,171 A | 4/1992 | Wen et al. | |
| 5,177,324 A | 1/1993 | Carr et al. | |
| 5,225,796 A | 7/1993 | Williams et al. | |
| 5,243,286 A | 9/1993 | Rzedzian et al. | |
| 5,349,317 A | 9/1994 | Notani et al. | |
| 5,371,404 A | 12/1994 | Juskey et al. | |
| 5,386,088 A | 1/1995 | Gardner | |

(Continued)

OTHER PUBLICATIONS

Web page titled "Outdoor Electronic Housings" Copyright 2007 W. L. Gore & Associates, Inc., author unknown, 1 page.

(Continued)

*Primary Examiner*—Hung S Bui
(74) *Attorney, Agent, or Firm*—Kolisch Hartwell, P.C.

(57) ABSTRACT

A cover assembly may be mounted on a substrate. The cover assembly may have an interior surface spaced from the substrate and may bound a hollow chamber over a circuit assembly. The hollow chamber may be filled with a fluid, such as a gas or a liquid. The cover assembly may also have an edge extending along the substrate around the circuit assembly and may include a dielectric cover, an electromagnetic shield, a conductive assembly, a resistive layer, and an aperture with a gas-permeable membrane. The electromagnetic shield. The dielectric cover may substantially enclose the hollow chamber bounded by the cover assembly. The electromagnetic shield may be attached to the dielectric cover and also substantially enclose the hollow chamber. The conductive assembly may extend along and may be electrically isolated from the electromagnetic shield. The conductive assembly may be conductively coupled to the circuit assembly.

29 Claims, 3 Drawing Sheets

U.S. PATENT DOCUMENTS

| | | |
|---|---|---|
| 5,528,203 A | 6/1996 | Mohwinkel et al. |
| 5,561,265 A | 10/1996 | Livshits et al. |
| 5,581,217 A | 12/1996 | Macdonald |
| 5,592,087 A | 1/1997 | Richard et al. |
| 5,635,754 A | 6/1997 | Strobel et al. |
| 5,639,989 A | 6/1997 | Higgins, III |
| 5,668,512 A | 9/1997 | Mohwinkel |
| 5,680,046 A | 10/1997 | Frederick et al. |
| 5,777,528 A | 7/1998 | Schumacher et al. |
| 5,981,043 A | 11/1999 | Murakami et al. |
| 5,981,869 A | 11/1999 | Kroger |
| 6,023,209 A | 2/2000 | Faulkner et al. |
| 6,232,548 B1 | 5/2001 | Eberler et al. |
| 6,294,731 B1 | 9/2001 | Lu et al. |
| 6,472,598 B1 | 10/2002 | Glenn |
| 6,515,222 B2 | 2/2003 | Underwood et al. |
| 6,707,682 B2 | 3/2004 | Akiba et al. |
| 6,743,975 B2 | 6/2004 | Kolb |
| 6,744,640 B2 | 6/2004 | Reis et al. |
| 6,788,171 B2 | 9/2004 | Ammar et al. |
| 6,803,655 B2 | 10/2004 | Fujio et al. |
| 6,881,896 B2 * | 4/2005 | Ebihara .................... 174/546 |
| 2003/0117787 A1 | 6/2003 | Nakauchi |

OTHER PUBLICATIONS

"Protective Vents for Telecommunications Equipment" Copyright 2007 W. L. Gore & Associates, Inc., author unknown, 2 pages.

"Gore Membrane Vents Snap-In Vent: UNIVENT" Copyright 2005 W. L. Gore & Associates, Inc., author unknown, 2 pages.

Dylan F. Williams, "Damping of the Resonant Modes of a Rectangular Metal Package," IEEE Transactions on Microwave Theory and Techniques, vol. 37, No. 1, Jan. 1989, pp. 253-256.

International Search Report and International Preliminary Examination Report, both mailed Oct. 12, 2006, for PCT application international publication No. WO/2006/011981, related to U.S. Appl. No. 10/882,886, which is the parent of the present application.

US 5,639,898, 06/1997, Higgins, III (withdrawn)

* cited by examiner

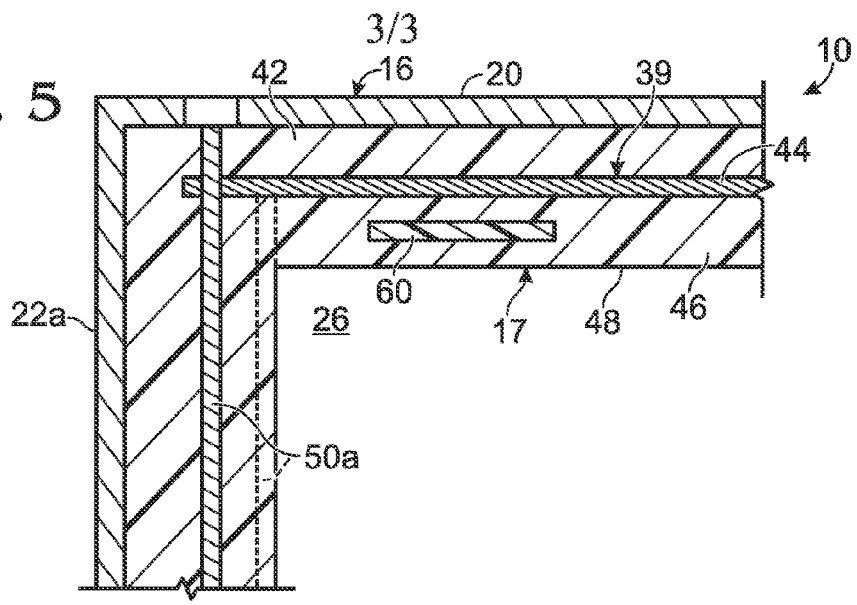
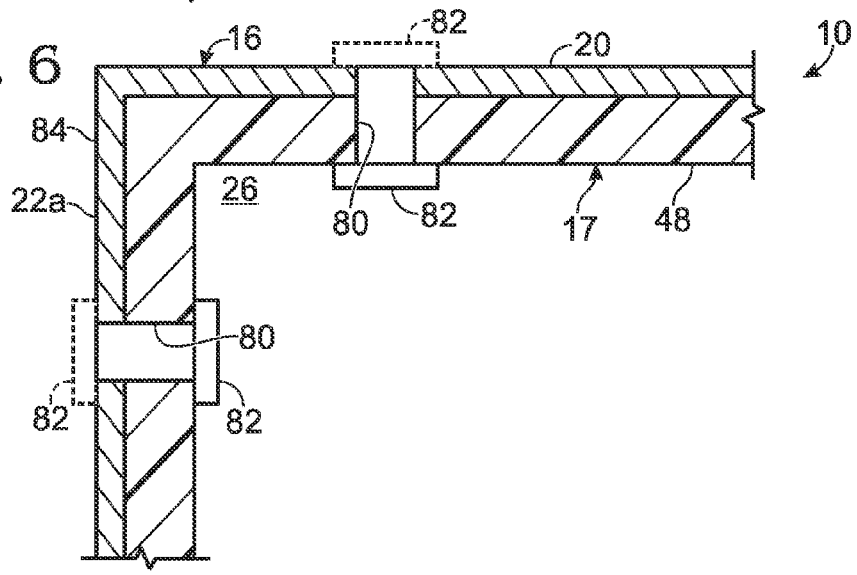
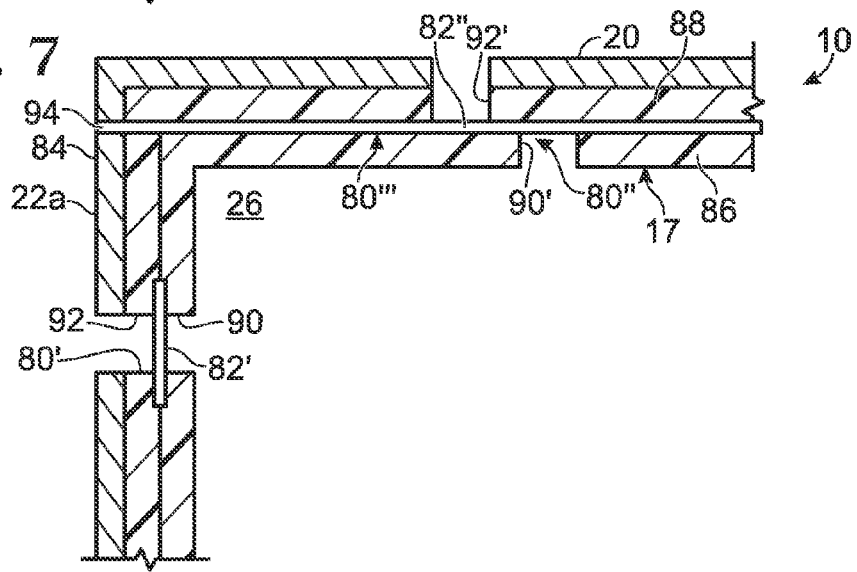

CIRCUIT STRUCTURE WITH MULTIFUNCTION CIRCUIT COVER

RELATED APPLICATIONS

The present application is a division and continuation-in-part application of U.S. patent application Ser. No. 10/882,886, filed on Jun. 30, 2004, the complete disclosure of which is hereby incorporated by reference herein in its entirety and for all purposes.

BACKGROUND

Electronic circuit components may be surrounded by shields, or covers, to suppress dangerous or disruptive electromagnetic (EM) radiation created by electronic circuit components at communication frequencies, including radio frequencies. In some environments, electronic components may be enclosed in some form of conductive cover that is connected to a circuit ground. An EM shield may be a solid metal housing or lid shaped to create a chamber enveloping an electronic circuit. EM shields have been developed for use in compact electronic environments that include numerous electronic components on a substrate. In such compact environments, the electronic components may be difficult to isolate from one another using individual encapsulating EM shields. Shields providing sufficient isolation take up space and also interfere with communication between the various shielded electronic circuits. In such compact environments there is a need to provide both effective EM shielding and proper inter-circuit communication while maintaining the compact size that is desired in an increasing number of electronic devices.

BRIEF SUMMARY OF THE DISCLOSURE

A cover assembly may be mounted on a substrate. The cover assembly may have an interior surface spaced from the substrate and may bound a hollow chamber over a circuit assembly. The hollow chamber may be filled with a fluid, such as a gas or a liquid. The cover assembly may also have an edge extending along the substrate around the circuit assembly and may include a dielectric cover, an electromagnetic shield, and a conductive assembly. The dielectric cover may substantially enclose the hollow chamber bounded by the cover assembly. In some examples, an electromagnetic shield may be attached to the dielectric cover and substantially enclose the hollow chamber. The conductive assembly may extend along and may be electrically isolated from the electromagnetic shield. The conductive assembly may be conductively coupled to the circuit assembly.

BRIEF DESCRIPTION OF THE FIGURES

FIGS. 5-7 are partial cross sections similar to FIG. 2 of other examples of cover assemblies.

DETAILED DESCRIPTION OF VARIOUS EMBODIMENTS

Figure 1:
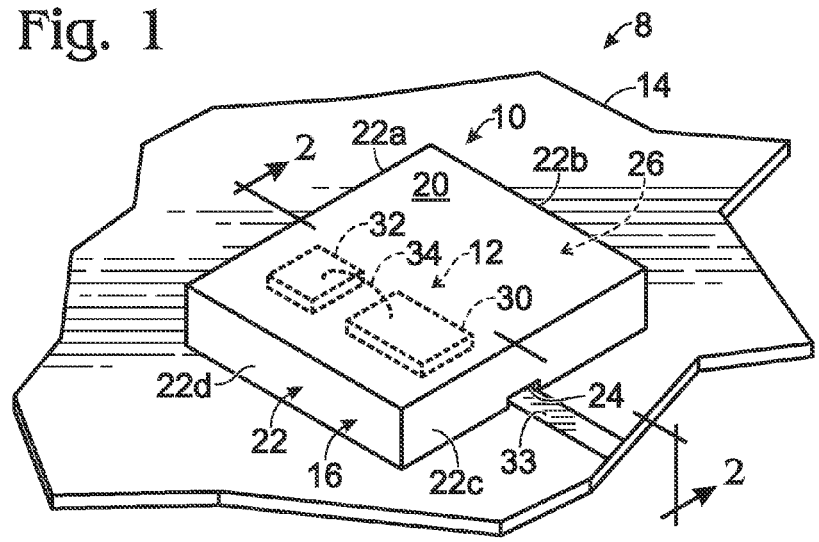
FIG. 1 is a plan view of a circuit structure including a cover assembly mounted on a substrate.

FIGS. 1-4 depict a simplified exemplary circuit structure 8 including a cover assembly 10, or cover having various features illustrated in a single composite embodiment for convenience. These features may have various forms, and may be realized in other cover assemblies individually or in various other combinations. As used herein, a cover assembly may house one or more circuit assemblies 12 that may individually or in combination form one or more complete circuits, one or more portions of one or more circuits, one or more combinations of elements or components of a circuit, or any combination of circuits, circuit portions, and circuit components, and may include shared circuit portions or components.

In this example, then, cover assembly 10 may be mounted to a substrate 14. Cover assembly 10, also referred to as an enclosure, may include an electromagnetically conductive layer forming an EM shield 16. Cover assembly 10 has a top or distal side 20, and intermediate sides 22, such as sides 22a, 22b, 22c, and 22d, forming an enclosed hollow chamber 26. The hollow chamber may be filled with a fluid, such as a gas or a liquid. When filled with highly insulating liquids, reliability of the enclosed circuit may be improved. Examples of such liquid include gamma butyrolactone, N-methyl-2-pyrrolidinone, hydrofluorocarbons or fluorinated hydrocarbons, fluorocarbons, polychlorobiphenyl, transformer oil (in general), mineral oil (of which there are many grades), and silicone oils. As seen in the cross-section of FIG. 2, the cover assembly may be a laminate, or may be composed of multiple layers. Conductive exterior or outer layer 16 may extend along the entire exterior of the cover assembly. Shield 16 may be made of an electromagnetically (including electrically or magnetically) conductive material, such as aluminum, copper or other metal, and may be formed of a combination of materials, at least one of which is conductive, such as a conductive layer with a non-conductive (dielectric) or semi-conductive material. Directly adjacent to the shield 16 may be dielectric layer or body 17. Dielectric body 17, also referred to as a dielectric cover, may be a composite layer further arranged in one or more layers.

The shield 16 may also include one or more openings or cutouts, such as cutout 24, to allow the passage of electric current, such as in the form of signals or power, into or out of the chamber 26 without substantial compromise to the shielding. While only one cutout is illustrated in this example it should be appreciated that EM shield 16 may include more than one cutout and that such cutouts may be located on the top or any side of cover assembly 10. As will be seen, an electrical conductor 33, shown mounted on substrate 14, may pass through cutout 24 to electrically connect circuit assembly 12 with other circuit assemblies or components located outside of the cover assembly. Conductor 33 may be a wire, a microstrip line, or any other configuration capable of conducting electrical current.

Cover assembly 10 may protect circuit assemblies, such as assembly 12, enclosed in chamber 26 from environmental and electromagnetic influences and/or isolate the enclosed circuit assemblies. While not shown, a cover assembly 10 may further include an interior wall that can separate chamber 26 into more than one sub-chamber that may be capable of isolating two or more circuit assemblies.

Circuit assembly 12 may include various components. For purposes of illustration, circuit assembly 12 may include respective circuit elements 30 and 32 connected by a suitable interconnect, such as by a bond wire 34. Bond wire 34 may be connected to circuit element 30 by connection to a terminal 31 positioned on the circuit element. Circuit element 30 may include a lumped or distributed element, or combination or network of passive and/or active elements, such as transmission lines, resistors, capacitors, inductors, and semiconductor devices, and may be mounted on a circuit chip having a dielectric, semiconductive or conductive substrate. Further-more, the circuit assembly 12 may include one or a combination of diodes and transistors in an integrated circuit (IC) or chip, including, for example, a monolithic microwave integrated circuit (MMIC), application specific integrated circuit (ASIC), or the like. For purposes of illustration, circuit element 32 may be an electrical conductor for transmitting a signal or power relative to circuit element 30.

Figure 2:
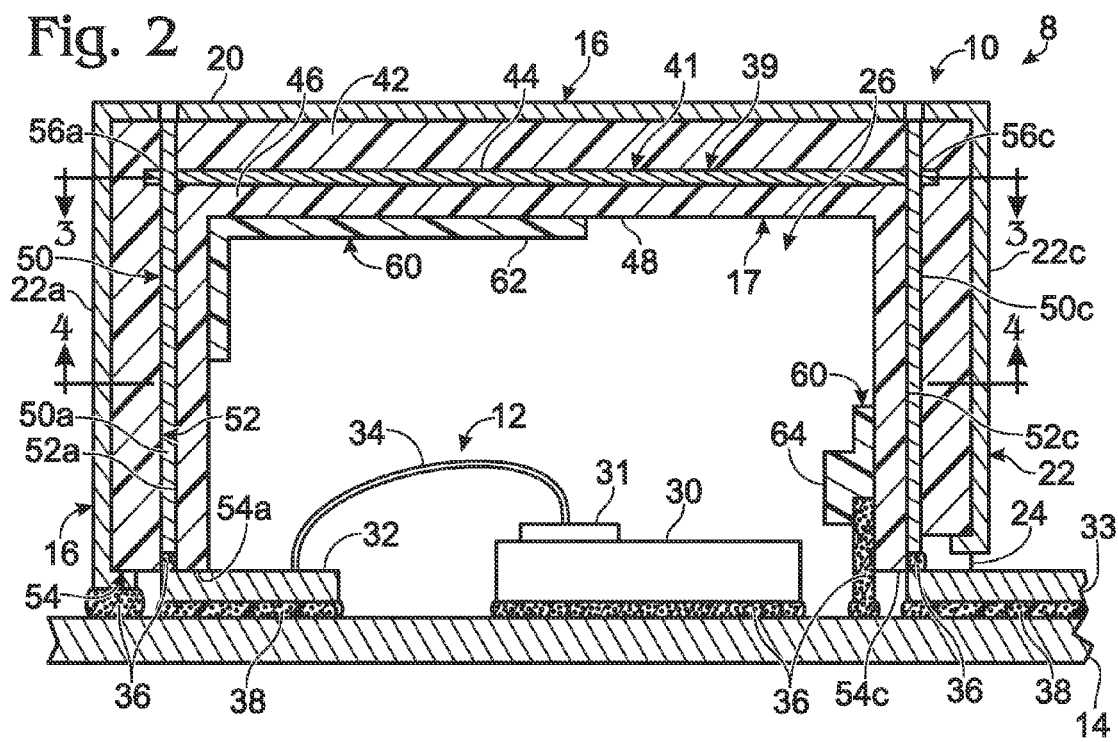
FIG. 2 is a cross section taken along line 2-2 of FIG. 1.
Figure 3:
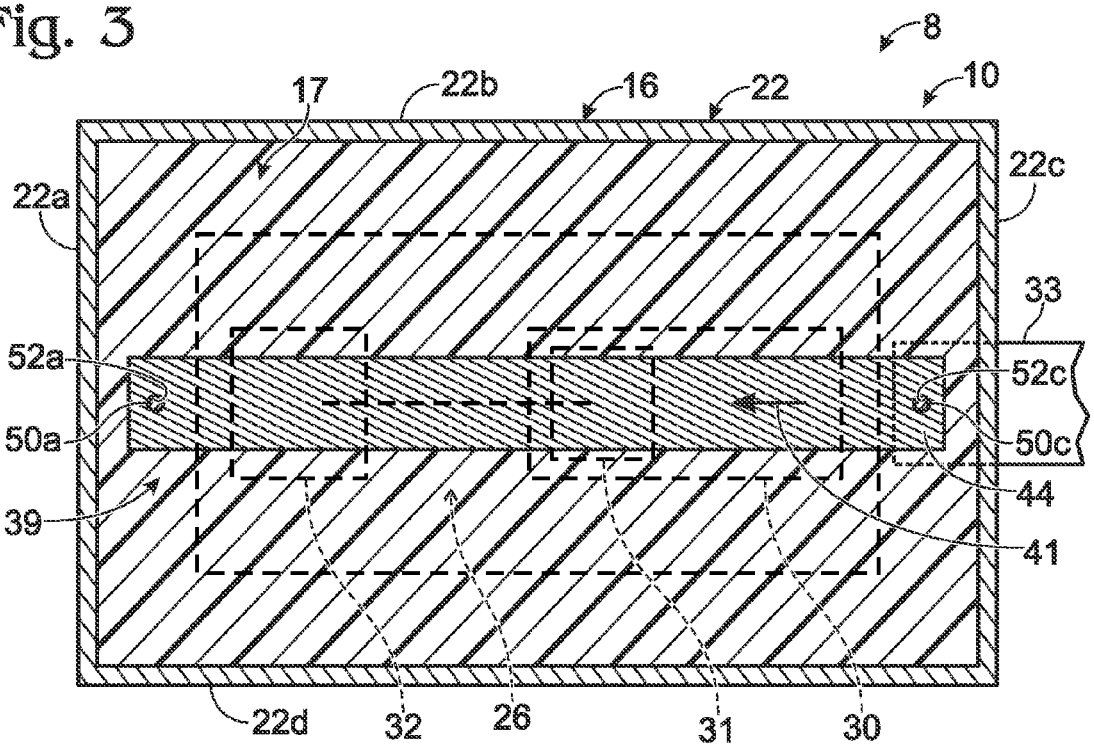
FIG. 3 is a cross section taken along line 3-3 of FIG. 2.

As seen in FIG. 2, the EM shield 16 may be mounted directly to substrate 14 at one or more points. In this example, substrate 14 is conductive and provides a ground for the shield. Other forms of substrate may be used, such as a dielectric with one or more conductive layers. Accordingly, shield 16 may be directly attached to substrate 14 using a conductive adhesive 36. Conductive adhesives may include conductive epoxy, conductive pads, solder, brazing material, deformed metal, z-axis conducting elastomer, or any similar conductive or resistive material. Further, there may be one or more types of conductive adhesive used in the mounting of cover assembly 10. It should be noted that cover-assembly side 22c may not be directly attached to substrate 14 in the area of cutout 24.

Optionally, EM shield 16 may include one or more electrical ground connectors (not here shown) for grounding the shield 16 to the local circuit ground. These ground connectors may be in the form of metal strips extending from one or more portions of the shield into the substrate, into an adjacent EM shield, or to whatever ground connection is available.

Conductors 32 and 33 may be mounted onto substrate 14 using insulating layers 38. The insulating layers may be in the form of an insulating epoxy or other adhesive, or an insulating pad. These insulating layers isolate the conductors from the conductive substrate. Circuit element 30 of circuit assembly 12 may require that it be grounded, in which case the backside of circuit element 30 may be attached to substrate 14 using conductive adhesive 36.

Cover assembly 10 may further include a conductive assembly 39 supported by a dielectric body 17 relative to shield 16. Conductive assembly 39 may provide a continuous electrical path 41 through or along the cover assembly. Path 41 may have branches, and multiple paths, whether adapted to carry signals or power. Components of the conductive assembly may extend along a surface of, or be embedded in, dielectric body 17. Dielectric body 17 may be a single layer of dielectric or a composite layer formed of a plurality of layers of dielectric, which layers may or may not be separated by one or more layers of non-dielectric material. In this example, dielectric body 17 includes first and second dielectric layers 42 and 46. The first and second dielectric layers 42 and 46 may be continuous along EM shield 16, extending along the cover-assembly top 20 and sides 22a, 22b, 22c, and 22d. Dielectric cover or body 17 may also extend only over one or more portions of shield 16. In some areas, the first and second dielectric layers 42 and 46 may merge into one layer, not separated by any non-dielectric material. The second dielectric layer 46 may have an interior or inner surface or face 48 that defines chamber 26. Although dielectric layers 42 and 46 are shown extending across the top and down the sides of the cover assembly, separate dielectric layers may be used, for instance, to form the portion of the dielectric body making up the sides.

Conductive assembly 39 may include a conductive strip 44 that may extend through or on dielectric body 17. In the configuration shown, the conductive strip 44 is sandwiched between first dielectric layer 42 and second dielectric layer 46. Conductive strip 44 may be composed of any suitable conductive materials including the conductive metals discussed above.

The cover-assembly intermediate sides 22a and 22c may include one or more vias 50, such as vias 50a and 50c, that extend between the first and second dielectric layers 42 and 46. The vias may be formed by drilling, etching, or otherwise creating respective elongated via holes 52, such as holes 52a and 52c. Such via holes, or tunnels, may extend between the first and second dielectric layers 42 and 46, or extend through an individual layer. These via holes may then be coated or partially or completely filled with electromagnetically conductive material to form the vias.

Vias 50a and 50c may extend the entire height of sides 22a and 22c, as shown. Cover assembly 10 may have a lower edge 54 in contact with substrate 14. Vias 50a and 50c, accordingly have lower ends or portions positioned near lower edge positions 54a and 54c of the cover assembly, and extend up to upper portions in contact with conductive strip 44 at respective intersection points 56a and 56c. The lower ends of the vias may be connected to signal conductors 32 and 33, respectively, by any suitable means, such as the use of conductive adhesive 36.

Vias 50a and 50c may connect with conductive strip 44 to form conductive assembly 39 within the cover assembly 10. Conductive assembly 39 may be capable of being used as part of a circuit. For example, conductive layer 33 may be capable of conducting current or a signal used or generated by circuit element 30 of circuit assembly 12. An electrical current may be conducted from circuit element 30, through terminal 31, bond wire 34, signal conductor 32, via 50a, conductive strip 44, via 50c, and conductor 33. Thus, through conductor 33, a signal or power may flow between circuit assembly 12 and a circuit outside of shielded chamber 26.

FIGS. 1-4 show an embodiment of a cover assembly 10 that includes only one conductive strip 44 embedded in cover assembly 10, and which interfaces with vias 52a and 52c at intersection points 56a and 56c, respectively. A cover assembly 10 may include more than one conductive strip or conductive assembly, and such strips may further be embedded between more than two isolating dielectric layers or extend on a dielectric layer or body. Similarly, while these figures show vias formed within two sides of the cover assembly, such vias may be contained within all or any combination of sides of the cover assembly. Some examples may include one or more conductive strips along sides 22 instead of or in addition to vias. Further there may be multiple vias and/or multiple conductive strips within any one side. Other forms or configurations for realizing a conductive assembly 39 may be used.

Cover assembly 10 may include portions of resistive material 60 that may be effective in damping undesired electrical propagation within chamber 26. Enclosures such as chamber 26 may have resonances at various frequencies that may interfere with the proper operation of circuit assembly 12 within the chamber 26. Resistive material 60 may decrease or provide damping to such resonances, and a layer of resistive material 60 may extend along all or part of dielectric layer 46.

Resistive material 60 may be a layer of resistive ink, film, paint, other resistive coating, or a combination thereof. This material may be applied by silk-screening, stenciling, spraying, squirting, painting, inkjet printing, lithography, offset printing, or any other convenient method. Optionally, resistive material 60 may be applied discontinuously according to a pattern of distribution so as to create multiple areas of resistive material.

As shown in FIG. 2, interior cover-assembly surface 48 may include a first resistive material area 62 that is uniform and covers a portion of the interior cover-assembly surface along both the top 20 and the side 22a of cover assembly 10. This interior surface may also include a second resistive material area 64 that covers only a portion of side 22c. The resistive material may be of uniform thickness, or the thickness may vary. Some areas of resistive material may be connected to substrate 14 using conductive adhesive 36.

Figure 4:
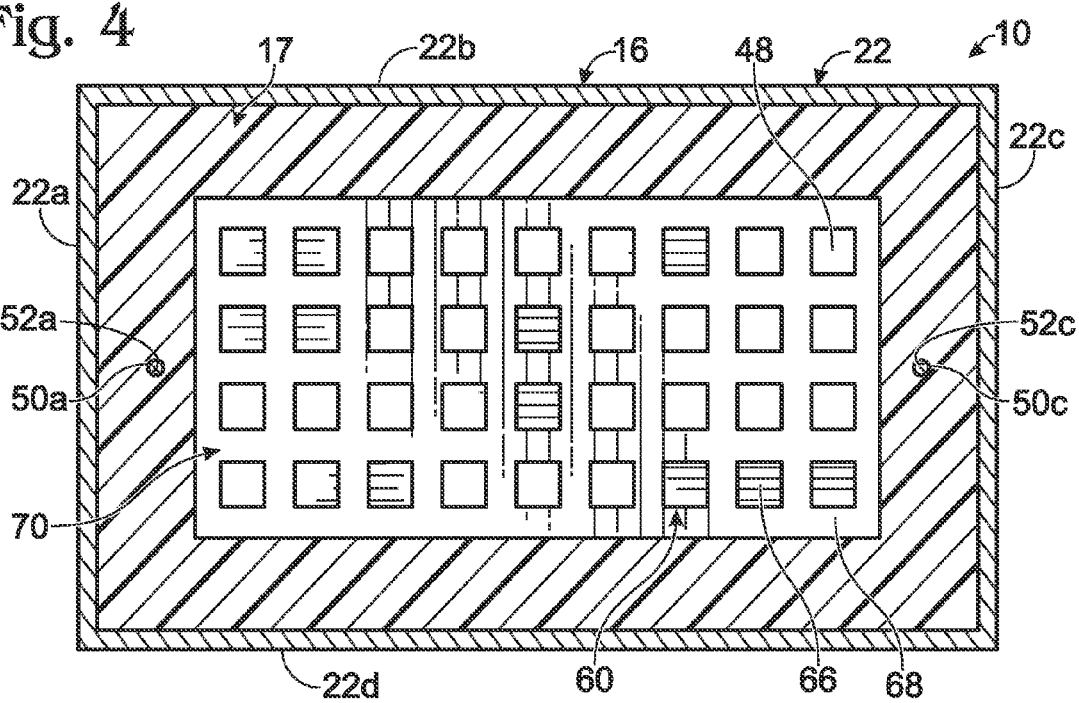
FIG. 4 is a cross section taken along line 4-4 of FIG. 2

An alternative embodiment is shown in FIG. 4. As seen in this cross-section, the interior cover-assembly surface may be covered with a resistive material 60 that is uniformly patterned. Such a pattern 70 may have a predetermined ratio of open, insulating areas 66 to covered, resistive material areas 68. This resistive material pattern 70 may be applied in a sheet or a film that may include a mesh. Such a film may be defined having an average resistivity of between 10 ohms/square and 1000 ohms/square.

Another embodiment is shown in FIG. 5. As seen in the cross-section, resistive material 60 is disposed within second dielectric body 17. Dielectric body 17 may be formed in multiple steps or layers such as by forming first and second dielectric layers 42 and 46. The resistive material may be applied to an intermediate surface by silk-screening, stenciling, spraying, squirting, painting, inkjet printing, lithography, offset printing, or any other convenient method. This resistive material 60 may be applied discontinuously according to a pattern of distribution so as to create multiple areas of resistive material, such as the pattern shown in FIG. 4. It will be appreciated then that resistive material 60 may be entirely on the interior surface of the cover assembly, entirely within the cover assembly, or partially within the cover assembly and partially on the surface of the cover assembly.

As has been mentioned, the addition of such a layer of resistive materials may result in damping of resonances and extraneous couplings within chamber 26 over a desired range of frequencies. In order to improve this damping, resistive material 60 may be selected according to resistivity, and the thickness and pattern in which the material may be applied. Additionally, damping may be improved by properly selecting the dielectric material included in the first and the second dielectric layers 42 and 46 of cover assembly 10, and the thickness of this dielectric material.

The cover assembly 10 may be fabricated from circuit board material, including conductive and dielectric material. Fabrication of the cover assembly 10 and/or the substrate 14, or the circuit structure 8 including the cover assembly 10, substrate 14, and associated circuitry, such as circuit assembly 12, can be carried out together with the items arrayed on panels. The mass fabrication on panels may then be followed by an operation to singulate the assemblies.

Through such an assembly, there may be multiple circuit assemblies 12 within each chamber 26, and there may be multiple chambers 26 within each cover assembly 10. Additionally, a given cover assembly may include or omit resistive material 60 for damping, and may include or omit conductive assembly 39.

FIG. 5 also shows in dashed lines a conductive element 50a, in place of via 50a, disposed partially on the interior surface 48 of cover assembly 10 and partially through dielectric layer 46, The portion of conductive element 50a on the interior surface may be applied using techniques similar to the techniques used to apply the resistive layer. The portion of the conductive element 50a passing through dielectric layer 46 may be in the form of a via. It will be appreciated then, that the conductive assembly 39 may be disposed partially or completely on an interior or exterior surface of the cover assembly, so long as it is electrically spaced from the electromagnetic shield 16.

Hollow chamber 26 may be filled with or contain gaseous material. In some examples, one or more gaseous species may evolve from materials such as adhesives, inks, and the like, or may be otherwise produced within the hollow chamber. In order to maintain integrity of the cover assembly, the assembly may include one or more apertures 80 that extend between the hollow chamber and the outside of the cover assembly, as shown in FIGS. 6-7. A membrane 82 may block or cover the aperture. In some examples, the membrane may permit one or more gaseous species to pass between the hollow chamber and outside of the cover assembly. Additionally or alternatively, the membrane may prevent liquids from passing between the hollow chamber and outside the cover assembly.

In FIG. 6, top or distal side 20 and side 22a each include apertures 80 that extend through the cover assembly, including electromagnetic shield 16 and dielectric body 17. A gas-permeable membrane 82 may extend across the aperture, such as by being adhered to interior surface 48, thereby covering the aperture. As shown in dashed lines in FIG. 6, the membrane may optionally be adhered to an exterior surface 84, thereby covering the aperture.

In FIG. 7, top or distal side 20 and side 22a are formed from a first dielectric layer 86 and a second dielectric layer 88 that generally surround or embed at least a portion of membranes 82' and 82". Aperture 80' formed in side 22a includes aperture portion 90 extending through first dielectric layer 86, aperture portion 92 extending through second dielectric layer 88, and electromagnetic shield 16. As can be seen in FIG. 7, aperture portions 90 and 92 of aperture 80' are generally aligned with each other and forming a portion of a uniform aperture 80' extending through the cover assembly between the interior and exterior surfaces of the cover assembly. Membrane 82' allows the one or more gaseous species to escape directly from the hollow chamber through the membrane 82' extending through aperture 80'.

Optionally, the membrane may extend well beyond the boundaries of one or more dielectric-layer aperture portions, such as illustrated by aperture membrane 82" in FIG. 7. In some examples, membrane 82" may extend to one of the surfaces of the cover assembly, such as exterior surface 84. In these examples, one or more gaseous species may enter the membrane at inner aperture portion 90' and may travel within the membrane along an extended aperture 80''' to an exposed portion 94, where the one or more gaseous species are emitted.

In other examples, an outer second aperture portion 92' may be disposed proximal to, but be partially or completely misaligned or offset from first aperture portion 90'. In some examples, aperture portions 90' and 92' of aperture 80" are completely offset (no portion of aperture portion 90' is aligned with aperture portion 92' of the aperture 80" extending between the faces of the cover assembly), such as shown in FIG. 7. In such examples, one or more gaseous species may enter the membrane at first aperture portion 90', migrate along an aperture portion containing the membrane between aperture portions 90' and 92', and enter aperture portion 92'.

In other examples, an aperture portion may extend only partially through the cover assembly, such as from one surface to a channel or passageway containing the membrane. Hence, in some examples only aperture portion 90' or aperture portion 92' may exist, but not both, and the membrane extends along a further aperture portion to a surface of the cover assembly, as in an aperture 80".

Membrane 82 may be formed from any appropriate gas permeable and/or liquid repellant material, such as porous polymer and/or fluoropolymer films, such as polytetraflouroethylene (ePTFE) sold under the proprietary name GORE-TEX® by W. L. Gore & Associates of Newark, Del., metal foils such as palladium foil, and the like. The membrane may permit all gaseous species to pass equally, or may permit some gaseous species, for example species with small molecules such as hydrogen gas, etc., to pass more readily than those with larger molecules such as water vapor. In some examples, the membrane may be conductive, or may include a conductive portion that is coupled to EM shield 16 or to the conductive assembly.

Optionally, a plug (not shown) including a membrane may be removably inserted into the aperture by threads or a similar retention mechanism. For example, it is known that plugs having such gas permeable materials covering a channel through the plug are used in the housings for outdoor units containing microwave radios to allow ventilation of the housing without admitting rain or atmospheric contaminants. Membrane vent plugs of this type are available from W. L. Gore & Associates.

Accordingly, while embodiments of circuit structures have been particularly shown and described with reference to the foregoing disclosure, many variations may be made therein. Other combinations and sub-combinations of features, functions, elements and/or properties may be used. Such variations, whether they are directed to different combinations or directed to the same combinations, whether different, broader, narrower or equal in scope, are also regarded as included within the subject matter of the present disclosure. The foregoing embodiments are illustrative, and no single feature or element is essential to all possible combinations that may be claimed in this or later applications. The claims, accordingly, define inventions disclosed in the foregoing disclosure. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

The invention claimed is:

1. A circuit structure comprising:
a substrate;
a circuit assembly mounted on the substrate; and
a cover assembly mounted on the substrate and having an interior surface spaced from the substrate and the circuit assembly and bounding a hollow chamber over the circuit assembly, the cover assembly having an edge extending along the substrate around the circuit assembly, the cover assembly including a dielectric cover and a conductive assembly, the dielectric cover substantially enclosing the hollow chamber bounded by the cover assembly and having a distal side opposite from the substrate and intermediate sides extending between the distal side and the substrate, the conductive assembly conductively coupled to the circuit assembly, extending along the dielectric cover, and including a conductive strip extending along the distal side of the dielectric cover, and a first via extending through the first intermediate side of the dielectric cover, the first via being connected to the conductive strip, and which, in combination with the conductive strip, forms a circuit path along the cover assembly.

2. The circuit structure of claim 1, in which the first via is also connected to the circuit assembly.

3. The circuit structure of claim 2 further comprising a conductor mounted on the substrate and extending outside of the cover assembly, and a second via extending through a second intermediate side of the cover assembly spaced from the first via, the second via connecting the conductive strip to the conductor.

4. A circuit structure comprising:
a substrate;
a circuit assembly mounted on the substrate; and
a cover assembly mounted on the substrate and having an interior surface spaced from the substrate and the circuit assembly and bounding a hollow chamber over the circuit assembly, the cover assembly having an edge extending along the substrate around the circuit assembly, the cover assembly including a dielectric cover having an inner surface facing and substantially enclosing the hollow chamber bounded by the cover assembly, a conductive assembly, and resistive material configured to dampen resonances in the hollow chamber, the conductive assembly conductively coupled to the circuit assembly and extending along the dielectric cover, and the resistive material distributed discontinuously along the inner surface in a uniform pattern having a predetermined ratio of portions without resistive material and portions with resistive material.

5. A circuit structure comprising:
a substrate;
a circuit assembly mounted on the substrate;
a cover assembly mounted on the substrate and having an interior surface spaced from the substrate and the circuit assembly and bounding a hollow chamber over the circuit assembly, the cover assembly having an edge extending along the substrate around the circuit assembly, the cover assembly including a dielectric cover, an electromagnetic shield, and a conductive assembly, the dielectric cover substantially enclosing the hollow chamber bounded by the cover assembly, the conductive assembly extending along the dielectric cover and conductively coupled to the circuit assembly, the electromagnetic shield being attached to the dielectric cover, substantially enclosing the hollow chamber bounded by the cover assembly, the electromagnetic shield including an opening providing access through the electromagnetic shield to the conductive assembly, the opening electrically isolating the electromagnetic shield from the conductive assembly; and
a conductor mounted on the substrate and extending through the opening from outside of the cover assembly and electrically coupled to the conductive assembly.

6. A circuit structure comprising:
a substrate;
a circuit assembly mounted on the substrate; and
a cover assembly mounted on the substrate and having an interior surface spaced from the substrate and the circuit assembly and bounding a hollow chamber over the circuit assembly, the cover assembly having an edge extending along the substrate around the circuit assembly, the cover assembly including a dielectric cover and a conductive assembly, the dielectric cover substantially enclosing the hollow chamber bounded by the cover assembly, and the conductive assembly conductively coupled to the circuit assembly and extending along the dielectric cover, there being an aperture extending through the cover assembly, and the cover assembly further including a membrane extending across the aperture and adapted to permit one or more gaseous species to pass through the aperture between the hollow chamber and outside of the cover assembly, and adapted to prevent liquids from passing through the aperture.

7. The circuit structure of claim 6, in which the membrane is adhered to an interior surface of the cover assembly, thereby covering the aperture.

8. The circuit structure of claim 6, in which the membrane is adhered to an exterior surface of the cover assembly, thereby covering the aperture.

9. The circuit structure of claim 6, in which
the dielectric cover includes a first dielectric layer proximal to the hollow chamber and a second dielectric layer distal to the hollow chamber,
the aperture includes a first aperture portion extending through the first dielectric layer and a second aperture portion extending through the second dielectric layer, and
the membrane is disposed between the first and second dielectric layers.

10. The circuit structure of claim 9, in which the first and second aperture portions are aligned, as viewed from the cover-assembly interior surface.

11. The circuit structure of claim 9, in which the first and second apertures are at least partially misaligned, as viewed from the cover-assembly interior surface, and the membrane extends between both the first and second aperture portions.

12. The circuit structure of claim 6, in which the membrane is disposed at least partially within the dielectric cover and extends to a surface of the cover assembly, and the aperture extends at least partially along the membrane.

13. The circuit structure of claim 6, in which the cover assembly has a distal side opposite from the substrate, and the aperture extends through the distal side.

14. The circuit structure of claim 6, in which the cover assembly has a distal side opposite from the substrate and intermediate sides extending between the distal side and the substrate, and the aperture extends through one of the intermediate sides.

15. A circuit structure comprising:
a substrate;
a circuit assembly mounted on the substrate; and
a cover assembly mounted on the substrate and defining a chamber and having an interior surface spaced from the substrate and substantially enclosing, spaced from, and electrically insulated from the circuit assembly, the cover assembly including a dielectric cover substantially enclosing the chamber, a resistive layer of electrically resistive material mounted to the dielectric cover and configured to attenuate electromagnetic resonances in the chamber, and an electromagnetic shield attached to the dielectric cover and substantially enclosing the chamber, the dielectric cover separating the electromagnetic shield and the resistive layer.

16. The circuit structure of claim 15, in which the resistive layer is disposed at least partially within the dielectric cover.

17. A circuit structure comprising:
a substrate;
a circuit assembly mounted on the substrate; and
a cover assembly mounted on the substrate and defining a chamber and having an interior surface spaced from the substrate and substantially enclosing, spaced from, and electrically insulated from the circuit assembly, the cover assembly including a dielectric cover substantially enclosing the chamber and a resistive layer of electrically resistive material mounted to the dielectric cover, configured to attenuate electromagnetic resonances in the chamber, and distributed discontinuously in a pattern.

18. The circuit structure of claim 17, in which the resistive layer is distributed in a pattern having regularly spaced open spaces.

19. The circuit structure of claim 18, in which the pattern is a uniform pattern having portions without resistive material and portions with resistive material.

20. A circuit structure comprising:
a substrate;
a circuit assembly mounted on the substrate; and
a cover assembly mounted on the substrate and having an interior surface bounding a hollow chamber and spaced from the substrate and the circuit assembly, the cover assembly having an edge extending along the substrate around the circuit assembly, an aperture extending through the cover assembly, the cover assembly including a dielectric cover, and a membrane extending across the aperture, the aperture providing fluid communication between the hollow chamber and outside of the cover assembly, and the membrane being adapted to permit one or more gaseous species to pass through the aperture and to prevent liquids from passing through the aperture.

21. The circuit structure of claim 20, in which the membrane is adhered to an interior surface of the dielectric cover, thereby covering the aperture.

22. The circuit structure of claim 20, in which the membrane is adhered to an exterior surface of the dielectric cover, thereby covering the aperture.

23. The circuit structure of claim 20, in which
the dielectric cover includes a first dielectric layer proximal to the hollow chamber and a second dielectric layer distal to the hollow chamber,
the aperture includes a first aperture portion extending through the first dielectric layer and a second aperture portion extending through the second dielectric layer, and
the membrane is disposed between the first and second dielectric layers.

24. The circuit structure of claim 23, in which the first and second aperture portions are aligned as viewed from the cover-assembly interior surface.

25. The circuit structure of claim 24, in which the first and second aperture portions are at least partially misaligned as viewed from the cover-assembly interior surface, and the membrane extends between the first and second aperture portions.

26. The circuit structure of claim 20, in which the membrane is disposed at least partially within the dielectric cover and extends to a surface of the cover assembly, and the aperture extends at least partially along the membrane.

27. The circuit structure of claim 20, in which the cover assembly has a distal side opposite from the substrate, and the aperture extends through the distal side.

28. The circuit structure of claim 20, in which the cover assembly has a distal side opposite from the substrate and intermediate sides extending between the distal side and the substrate, and the aperture extends through one of the intermediate sides.

29. The circuit structure of claim 20, in which the cover assembly includes an electromagnetic shield attached to the dielectric cover and substantially enclosing the chamber, the aperture extending through the electromagnetic shield.

* * * * *